United States Patent
Thirunavukarasu et al.

(10) Patent No.: US 11,111,583 B2
(45) Date of Patent: Sep. 7, 2021

(54) SUBSTRATE CARRIER SYSTEM UTILIZING ELECTROSTATIC CHUCKING TO ACCOMMODATE SUBSTRATE SIZE HETEROGENEITY

(71) Applicant: APPLIED MATERIALS, INC., Santa Clara, CA (US)

(72) Inventors: Sriskantharajah Thirunavukarasu, Singapore (SG); Karthik Elumalai, Bangalore (IN); Jen Sern Lew, Singapore (SG); Mingwei Zhu, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/827,845

(22) Filed: Nov. 30, 2017

(65) Prior Publication Data

US 2018/0112310 A1    Apr. 26, 2018

Related U.S. Application Data

(62) Division of application No. 14/538,769, filed on Nov. 11, 2014, now Pat. No. 9,845,533.

(51) Int. Cl.
*C23C 16/458* (2006.01)
*H01L 21/683* (2006.01)
*H01L 21/687* (2006.01)
*C23C 16/30* (2006.01)

(52) U.S. Cl.
CPC ...... *C23C 16/4586* (2013.01); *H01L 21/6831* (2013.01); *H01L 21/68771* (2013.01); *C23C 16/303* (2013.01)

(58) Field of Classification Search
None
See application file for complete search history.

(56) References Cited

U.S. PATENT DOCUMENTS

| | | | |
|---|---|---|---|
| 5,671,116 A * | 9/1997 | Husain | H01L 21/67103 361/234 |
| 5,978,202 A | 11/1999 | Wadensweiler et al. | |
| 7,821,767 B2 | 10/2010 | Fujii | |
| 2007/0297118 A1 * | 12/2007 | Fujii | H01L 21/6833 361/234 |
| 2008/0237819 A1 * | 10/2008 | Wieland | H02N 13/00 257/676 |
| 2015/0122776 A1 * | 5/2015 | Okita | H01L 21/67069 216/67 |

* cited by examiner

*Primary Examiner* — Steven M Christopher
(74) *Attorney, Agent, or Firm* — Moser Taboada

(57) ABSTRACT

Embodiments of improved substrate carriers are provided herein. In some embodiments, a substrate carrier, includes: a multi-layered disk having upper and lower layers formed of a continuous material and an electrostatic electrode structure disposed therebetween, wherein the multi-layered disk is dimensioned and arranged so as to have a nominal dimension which exceeds a nominal dimension of a standard substrate size used in the manufacture of light emitting diode devices, and wherein the multi-layered disk is formed symmetrically about a central axis and defines a substantially planar upper surface.

20 Claims, 4 Drawing Sheets

SUBSTRATE CARRIER SYSTEM UTILIZING ELECTROSTATIC CHUCKING TO ACCOMMODATE SUBSTRATE SIZE HETEROGENEITY

CROSS-REFERENCE TO RELATED APPLICATIONS

This application is a divisional of co-pending U.S. patent application Ser. No. 14/538,769, filed Nov. 11, 2014, which is herein incorporated by reference in its entirety.

FIELD

Embodiments of the present disclosure relate generally to the field of semiconductor manufacturing and, more particularly, to handling of substrates in a substrate testing and/or processing procedure.

BACKGROUND

The fabrication of light-emitting diodes (LEDs) and other high-performance devices, such as laser diodes, optical detectors, and field effect transistors, typically utilizes a vacuum deposition process (e.g., physical vapor deposition (PVD), chemical vapor deposition (CVD), atomic layer deposition (ALD), etc.), to grow a thin film stack structure of group-III nitride (or other materials) over a sapphire, silicon carbide, or silicon substrate. A thin-film vacuum deposition tool includes a process chamber, which is a sealed environment that allows infused gases to be deposited upon the substrate (typically in the form of wafers) to grow the thin film layers. An example of a current product line of such manufacturing equipment is the Impulse™ PVD AlN Chamber for deposition of a high quality aluminum nitride (AlN) buffer for gallium nitride LED, manufactured by Applied Materials Inc.

Substrate carriers support one or more substrates (such as wafers) and are used to transport and hold the one or more wafers inside furnaces, CVD and PVD process chambers, and/or other equipment. The carriers are frequently made of materials such as silicon carbide, silicon, or silicon carbide coated graphite, which allow them to be used at the elevated temperatures inside furnaces while the wafers are being processed. Depending on the materials that carriers are made of, the carriers can change size and/or deform (e.g., by "bowing") over time while exposed to elevated temperatures. This can pose a problem to substrate handling automation. Additionally, these carriers are also limited in their useful temperature range. In certain processes, some commonly used materials cannot be used because the carrier would deform to an unusable state rather quickly. If the carriers change dimensionally after a period of time due to the stresses of the fabrication processes, they could prove to be unusable in the substrate loading equipment.

Wafers having a diameter of 8 inches or more are commonly used in the semiconductor industry for the manufacture of integrated circuits. However, for such specialized devices as LEDs, sapphire wafers having a diameter smaller than 8 inches are often specified. Substrate carriers are typically configured to support a wafer or substrate of a given size, e.g., a given diameter. Thus, different substrate carriers are typically provided to support substrates of differing dimensions, which leads to increase in cost and complexity of substrate processing equipment.

Thus, the inventors have provided embodiments of improved substrate carriers that address one or more of the above disadvantages.

SUMMARY

Embodiments of improved substrate carriers are provided herein. In some embodiments, a substrate carrier, includes: a multi-layered disk having upper and lower layers formed of a continuous material and an electrostatic electrode structure disposed therebetween, wherein the multi-layered disk is dimensioned and arranged so as to have a nominal dimension which exceeds a nominal dimension of a standard substrate size used in the manufacture of light emitting diode devices, and wherein the multi-layered disk is formed symmetrically about a central axis and defines a substantially planar upper surface.

In some embodiments, a method of processing a substrate, includes: providing a substrate carrier comprising a multi-layered disk having upper and lower layers formed of a continuous material and an electrostatic; electrode structure disposed therebetween, wherein the multi-layered disk is dimensioned and arranged so as to have a nominal dimension which exceeds a nominal dimension of a standard substrate size used in the manufacture of light emitting diode devices, and wherein the multi-layered disk is formed symmetrically about a central axis and defines a substantially planar upper surface; placing a first substrate onto the planar upper surface; placing a second substrate onto the planar upper surface; energizing the electrode structure using a voltage source; and placing the substrate carrier into a process chamber.

In some embodiments, a substrate carrier includes; an electrostatic chuck structure disposed between upper and lower layers of aluminum nitride, wherein the upper layer defines a polished, planar upper surface; and wherein the carrier is dimensioned and arranged so as to have a nominal dimension which is a multiple of at least one of six, four, three, and two inches so as to accommodate alternate placement, on the planar upper surface, of a first combination of substrates wherein all substrates of the first combination have a common nominal dimension; or a second combination of substrates wherein at least one substrate of the second combination has a nominal dimension which is different from a nominal dimension of at least one other substrate of the second combination.

Other and further aspects, features, and advantages will be apparent from the following description of the embodiments of the disclosure given for the purpose of disclosure.

BRIEF DESCRIPTION OF THE DRAWINGS

Embodiments, briefly summarized above and discussed in greater detail below, can be understood by reference to the appended drawings. It is to be noted, however, that the appended drawings illustrate only typical embodiments and are therefore not to be considered limiting, for the inventive concepts disclosed herein may admit to other equally effective embodiments.

Figure 1:
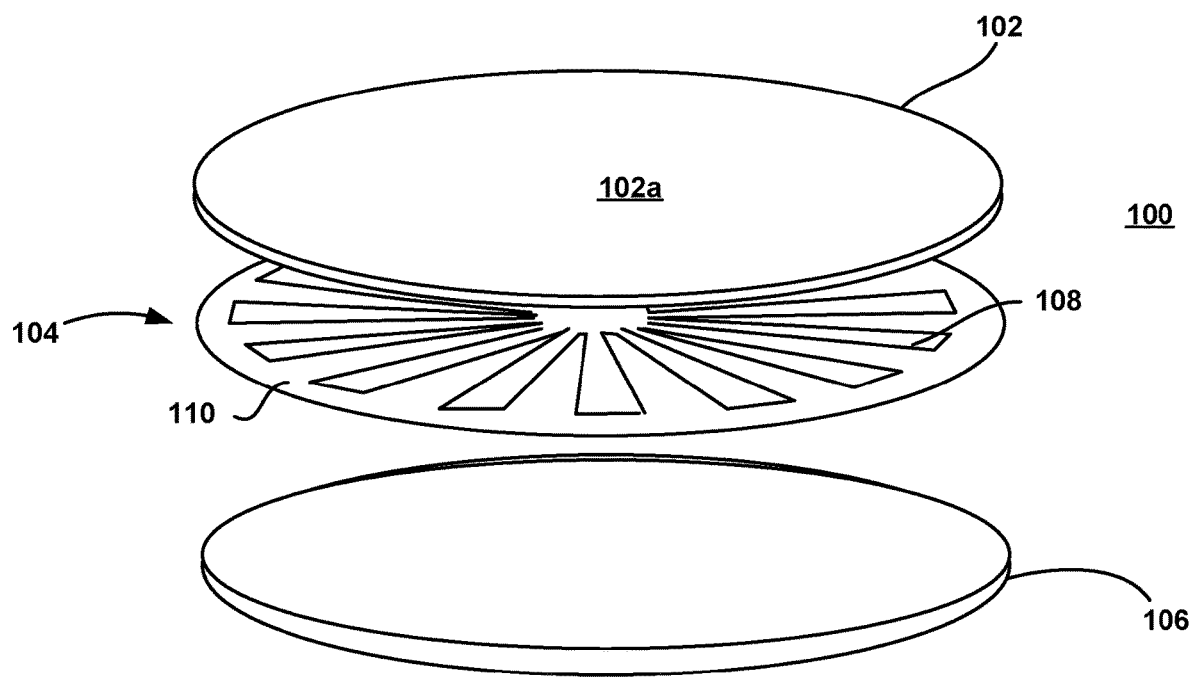
FIG. 1 depicts an exploded view depicting a substrate carrier constructed in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of improved substrate carriers are provided herein. The substrate carriers advantageously need no configuration or adjustment in operation to support simultaneous processing or testing of a plurality of substrates. The plurality of substrates supported may have nominal dimension homogeneity (e.g., all supported substrates having a circular periphery and a common nominal diameter, such as two (2), three (3), four (4), or six (6) inches or the like) or nominal dimension heterogeneity (e.g., at least some substrates having a circular periphery and a nominal diameter different from the nominal diameter of at least one other substrate being processed)

Provided herein are embodiments of substrate carriers which may provide the above advantages. For example, in some embodiments, a substrate carrier comprises a multi-layered disk formed about a central axis and machined to twice the size of a substrate typically used in the fabrication of LED devices, the disk including an upper layer having a substantially planar upper surface, a lower layer, and a bipolar electrode structure disposed between the upper and lower layers. In use, following placement of one or more substrates upon the upper surface, a voltage may be applied to the electrode structure to exert an electrostatic holding force upon the at least one substrate in order to maintain the substrate in position during transport of the carrier and any subsequent processing or testing steps.

In some embodiments, the substrates are wafers of a material commonly used in the fabrication of LED devices such, for example, as sapphire, silicon carbide, and/or silicon. In some embodiments, the upper and lower layers of the substrate carrier may be constructed of aluminum nitride. Nominal sapphire wafers of standard size are typically six inches, four inches, three inches, or two inches in diameter. In some embodiments, combinations of substrates having the same or differing diameters may be placed upon the upper surface of the upper layer and electrostatically maintained in position on the substrate carrier. In some embodiments, the multi-layered disk has a nominal diameter which is a multiple of one or more of the above-identified standard nominal sapphire wafer sizes. Choosing, for example, a multi-layered disk diameter of 12 inches advantageously allows smaller wafers or test chips to run in a standard process chamber without having to reconfigure the process chamber size and robot calibrations and without sacrificing processing results on the small wafers or test chips. A diameter of 12 inches is also a multiple of all of the standard nominal sapphire wafer sizes identified above, thus advantageously minimizing the need for time-consuming system size reconfigurations, and reducing the chance of contamination by minimizing process chamber and robot exposure to ambient.

Other nominal wafer dimensions may in the future be accepted as standard, for manufacturing process equipment compatibility purposes. Thus, a multi-layered disk constructed according to some embodiments may be configured with a nominal dimension that is a multiple of one or more such later-accepted dimension(s). Moreover, though substrates of circular profile corresponding to wafers have been described and illustrated in connection with certain embodiments, the substrates may have other shapes as well (e.g., rectangular or other). Moreover, the actual profile shape of the multi-layered substrate need not conform to the profile of the substrates supported on the upper surface thereof.

Within initial reference to FIG. 1, there is shown an exploded view depicting a substrate carrier 100 constructed in accordance with an illustrative embodiment. As seen in FIG. 1, the substrate carrier 100 comprises a multi-layered disk that includes an upper layer 102 having a planar upper surface 102a, a lower layer 106, and a central layer 104 disposed therebetween and configured as an electrostatic chuck. For example, in some embodiments, the central layer 104 may be configured as a bipolar electrode structure having a first or inner electrode 108 and a second or outer electrode 110.

The substrate carrier 100 is configured to be handled by conventional substrate handling equipment, such as substrate transfer robots, substrate supports, and the like. As such, the substrate carrier 100 is a discrete element that is not fixedly coupled to other substrate processing equipment and may be moved from location to location to facilitate the processing of substrates retained on the substrate carrier 100. In some embodiments, the lower layer 106 includes a substantially planar lower surface opposite the upper surface 102a to facilitate placement on a substrate support.

In some embodiments, the upper surface 102a of the substrate carrier 100 defines a plurality of discrete substrate supporting regions. In such embodiments, one or more independently operable electrodes for each region may be defined in central layer 104. According to some embodiments, a source of potential is applied to the electrode(s) to build up an electrostatic charge which is of sufficient attractive force and which persists long enough to permit movement of the carrier between one processing station (not shown) and another. If the electrostatic forces persist beyond the period where needed, the forces are neutralized by applying a potential of opposite polarity. Alternatively or in addition, the central layer 104 is dimensioned and arranged to define one or more terminals which can remain in registration with an external source of potential as the substrate carrier 100 is moved from one processing station, tool and/or chamber to a subsequent processing station, tool, and/or chamber. In this regard, in some embodiments, central layer 104 defines electrode terminals along a peripheral side wall so that these are alignable with the external source of potential.

When a material such as aluminum nitride is used for the upper and lower layers, the thickness of each of the upper and lower layers is on the order of from about 0.35 to about 0.6 mm. The overall thickness between the substantially planar upper surface 102a and the substantially planar lower surface defined by the lower layer 106 is one the order of from about 0.35 to about 0.6 mm for an illustrative embodiment configured for carrying sapphire wafers having a thickness of 0.7 to about 1.2 mm. The thickness of the layers individually and of the multi-layered disk overall may vary depending upon the materials used for the construction of the multi-layered disk and upon the substrate to be supported.

Figure 2A:
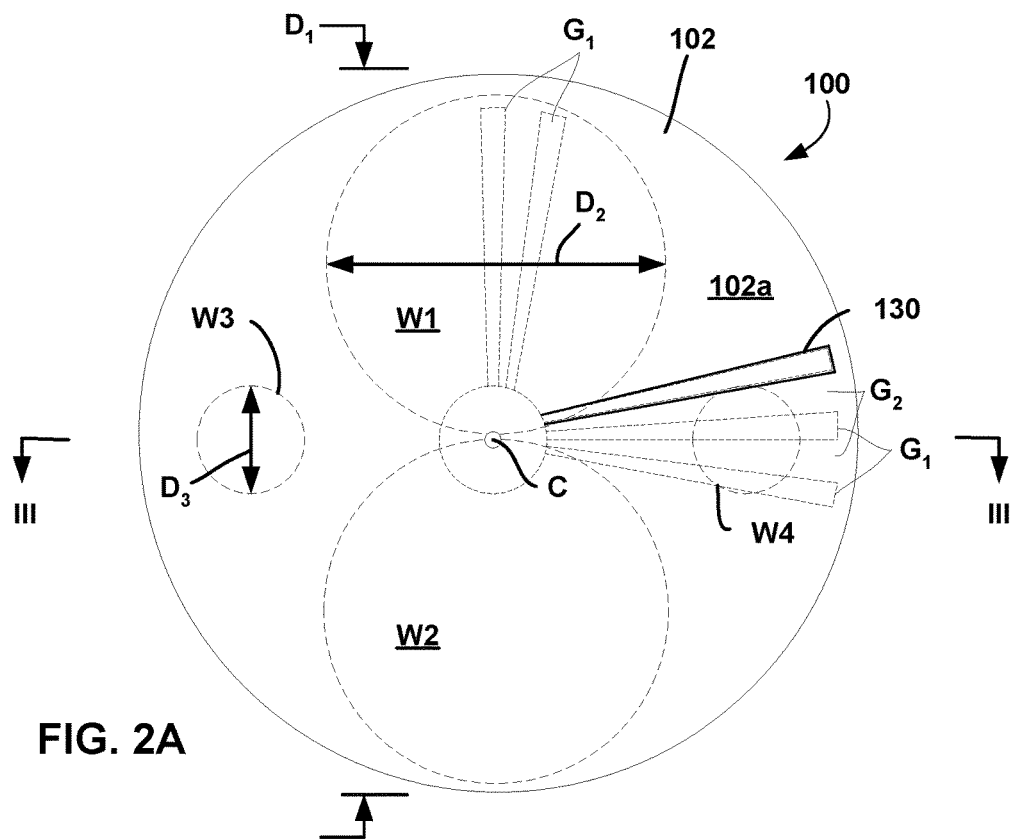
FIG. 2A depicts a top plan view of the exemplary substrate carrier of FIG. 1.

FIG. 2A depicts a top plan view of the exemplary substrate carrier of FIG. 1, and shows that the multi-layered disk of carrier 100 has a nominal diameter $D_1$. Illustratively positioned on the upper surface 102a of the substrate carrier 100 are a first pair of wafers W1 and W2 having a first diameter $D_2$ and a second pair of wafers having a second diameter $D_3$. According to an illustrative embodiment, the diameter $D_1$ is on the order of 300.0 to 301.0 mm, the diameter $D_2$ is about 150 mm, and the diameter $D_3$ is about 50 mm. The substrates as substrates W1 and W2 are typically deposited onto the upper surface 102a using a vacuum gripper or electrostatic chuck structure. Due to the planar nature of upper surface 102a, the substrates can be placed and removed using conventional vacuum and/or electrostatic gripping tools without the attendant risk of impact damage (e.g., chipping or cracking) which might otherwise be caused when a substrate impacts another substrate or a carrier sidewall structure. Moreover, reuse is made substantially easier. That is, once substrate(s) deposited on the substrate carrier 100 have been processed and removed, traditional machining, etching, and/or polishing operations may be performed to return the carrier to a condition ready for service.

Figure 2B:
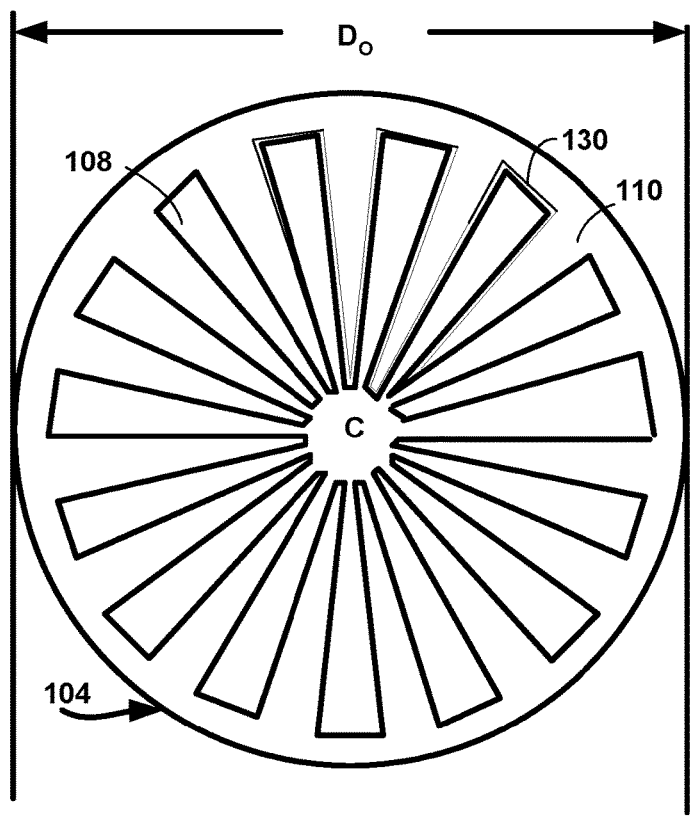
FIG. 2B depicts a top plan view of an exemplary bipolar electrode structure forming part of the structure depicted in the embodiment of FIGS. 1 and 2A.

FIG. 2B shows is top plan view of the electrode structure of the central layer 104 of FIGS. 1 and 2A. In the embodiment of FIG. 2B, a first group of electrode fingers or elements (indicated generally at $G_1$ in FIG. 2A), comprise inner electrode 108. Each of the electrode fingers extends radially outward from a central axis. A second group of electrode regions or elements (indicated generally at $G_2$ in FIG. 2A), comprise outer electrode 110. Between the inner electrode and outer electrode is a gap 130 on the order of from about 1.0 to about 3.0 mm. In some embodiments, the diameter of the outer electrode 110 is on the order of from about 285 to about 295 mm. The thickness of each of electrodes 108 and 110 is from about 10 to 30 microns. In some embodiments, each of electrodes 108 and 10 is fabricated from an electrically and thermally conductive material such as molybdenum, tungsten, or silver.

Figure 3:
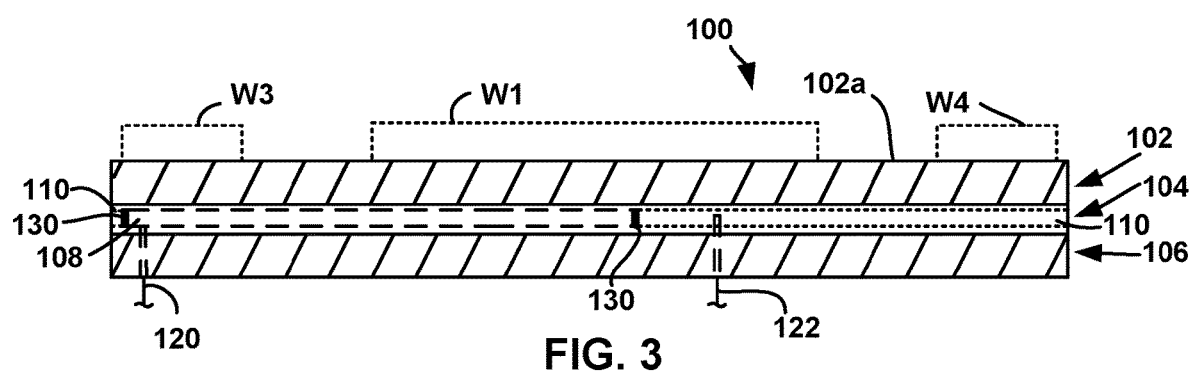
FIG. 3 is a cross sectional view depicting the exemplary substrate carrier of FIGS. 1 and 2A, taken across the reference plane III-III shown in FIG. 2A.

Turning now to FIG. 3, there is shown a cross sectional view depicting the exemplary substrate carrier of FIGS. 1 and 2A, taken across the reference plane III-III shown in FIG. 2A. In use, first and second terminals indicated at 120 and 122, respectively, facilitate application of a voltage of the appropriate magnitude and polarity to each group of electrodes so as to develop the requisite electrostatic clamping forces for retaining the substrates positioned on the upper surface 102a. In some embodiments, the voltages and polarities applied to the respective terminals 120 and 122 are in the range of from about +2.0 kV to about +3.0 kV to the terminal 120 and from about −2.0 kV to about −3.0 kV to the terminal 122.

Figure 4A:
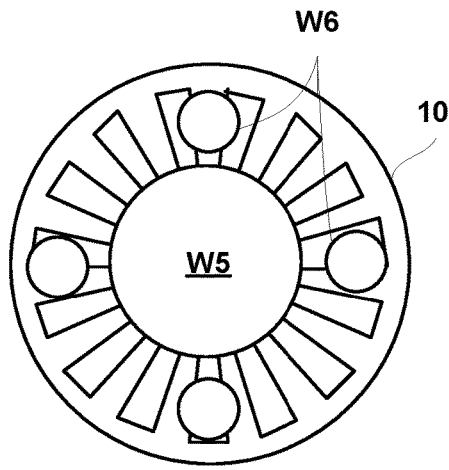
FIGS. 4A through 4E are top plan views of the exemplary substrate carrier of FIGS. 1 to 3, depicting the placement of various combinations of substrates according to one or more embodiments of the present disclosure.
Figure 4B:
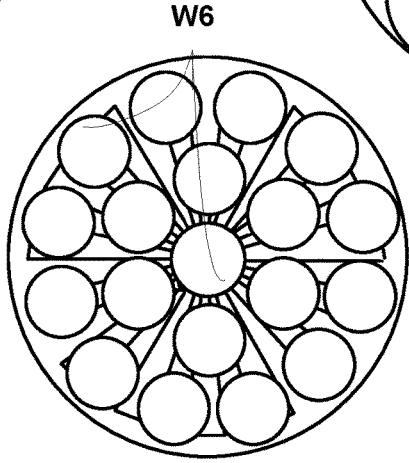
Figure 4D:
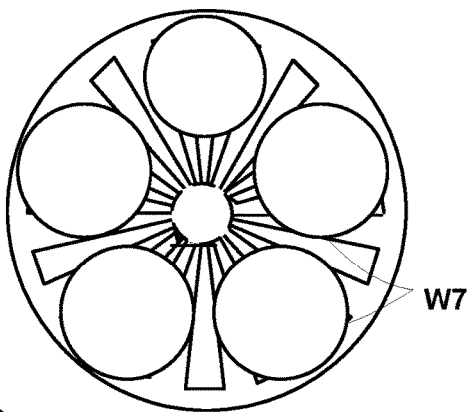
Figure 4C:
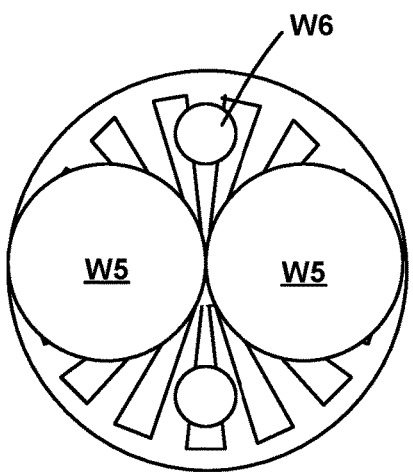
Figure 4E:
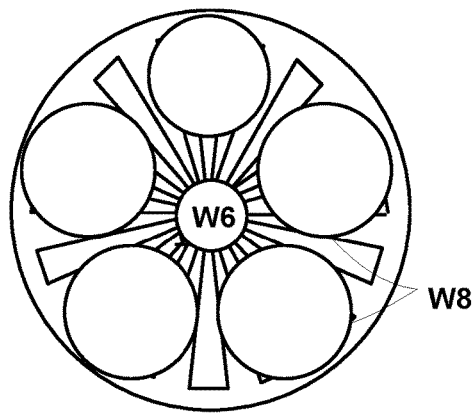

FIGS. 4A through 4E are top plan views of the exemplary substrate carrier of FIGS. 1 to 3, depicting the placement of various combinations of substrates according to one or more embodiments of the present disclosure. The illustrative combinations for an exemplary disk having a nominal diameter of 300 mm (approximately 12") includes one 6 inch wafer indicated at W5 and four 2 inch wafers indicated at W6 (FIG. 4A), nineteen 2" wafers indicated at W6 (FIG. 4B), two 6 inch wafers indicated at W5 and two 2 inch wafers indicated at W6 (FIGS. 2 and 4C), five 4 inch wafers indicated at W7 (FIG. 4D) and one 2 inch wafer indicated at W6 and five 4 inch wafers indicated at W8 (FIG. 4E). Other configurations for substrate carriers having a 300 mm disk diameter may also be used. The substrate carrier may have a nominal diameter other than 300 mm as well.

Figure 5:
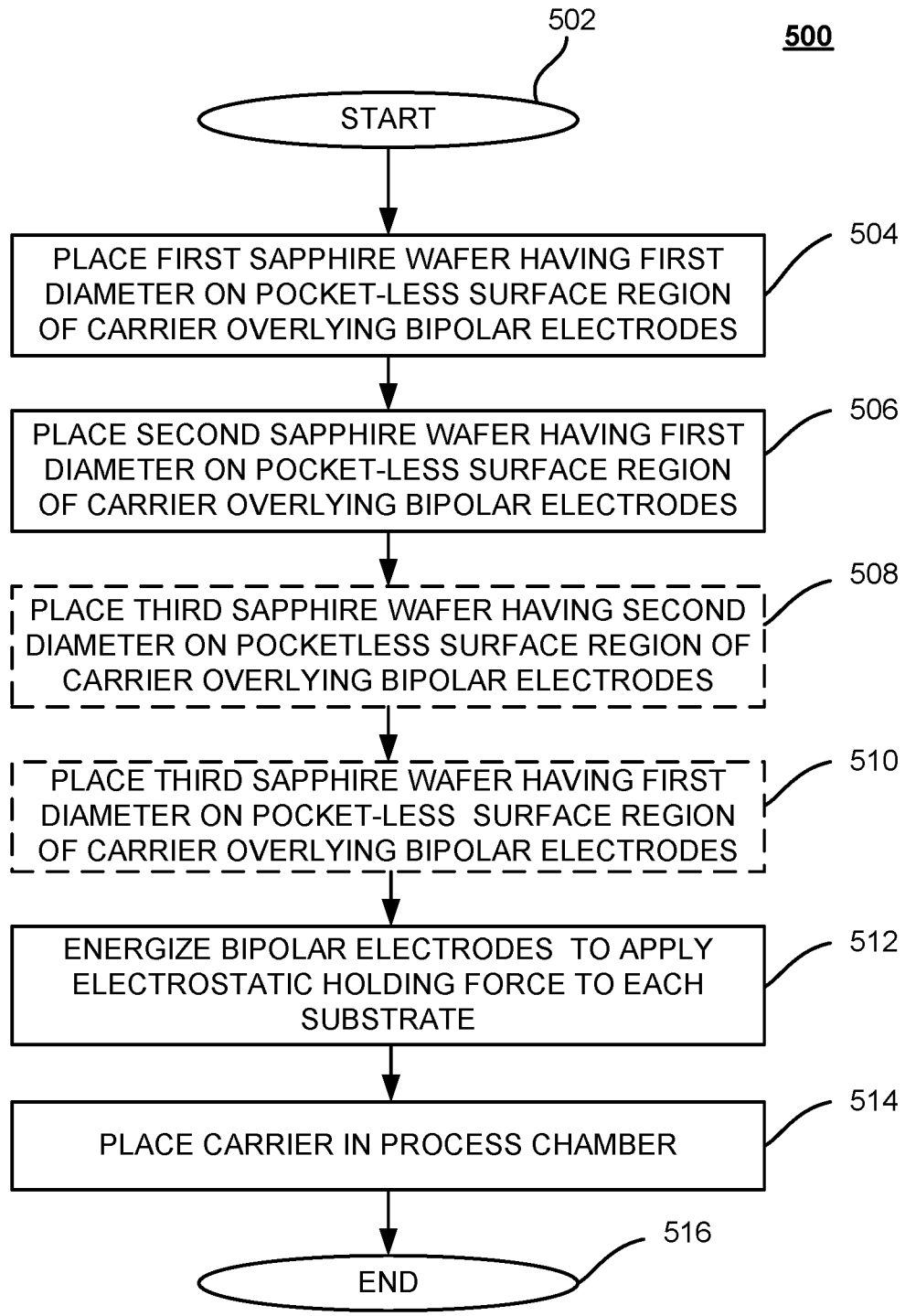
FIG. 5 depicts a flow chart of a process for using a substrate carrier configured in accordance with some embodiments of the present disclosure.

FIG. 5 depicts a flow chart of a process 500 for using a substrate carrier configured according to embodiments of the present disclosure. The process 500 is entered at 502 and advances to 504 where a first substrate such as a wafer having a first diameter of, for example, four or six inches is placed on an upper surface region of the multi-layered carrier disk so as to overlie at least one electrode of each polarity from each of two groups of electrodes. The process proceeds to 506, where a second substrate having the first diameter is placed on a second upper surface region of the carrier disk. The process optionally proceeds to 508, where a third substrate having a second diameter smaller or larger than the first diameter is optionally placed on a third surface region of the carrier disk. Alternatively or in addition, the process may optionally proceed from either of 506 or 508 to 510, where a fourth (or third) substrate having the first diameter is placed within an available space on the carrier surface (e.g., upper surface 102a of FIG. 1). In some embodiments, the process 500 utilizes a disk fabricated and dimensioned and arranged as described for the embodiment shown FIGS. 1-4E above. The placement of the substrate on the substrate carrier can be done, for example, manually or robotically.

The substrate carrier is compatible with the gas and temperature environment in a standard process chamber. This allows standard processing to be performed with the disk able to be handled and processed like a standard substrate. Thus, the substrate carrier used in the process 500 can be reused repeatedly in a high temperature and corrosive environment.

With continued reference to FIG. 5, as set forth in block 512, a bipolar electrode structure underlying the substrates placed on the respective upper surface regions is energized so as to apply electrostatic retaining forces holding each substrate against a respective upper surface region. The process 500 proceeds to 514, where the unprocessed substrates carried by the loaded substrate carrier are transferred to a process chamber where one or more processes may be performed on the substrates disposed on the substrate carrier. For example, typical processes for forming LED devices upon sapphire wafers involve depositing by chemical vapor deposition and/or physical vapor deposition, one or more layers of a material such as aluminum nitride (AlN), gallium nitride (GaN), aluminum gallium nitride (AlGaN), indium nitride (InN), gallium indium nitride (GaInN), aluminum gallium indium nitride (AlGaInN), or the like. Similar or other processes may be performed on substrates of other dimensions and/or materials.

Various modifications and variations of the above-disclosed embodiments can be made without departing from the spirit or scope of the inventive principles embodied therein. Thus, while the foregoing is directed to embodiments of the present disclosure, other and further embodiments of the disclosure may be devised without departing from the basic scope thereof.

The invention claimed is:
1. A method of processing a substrate, comprising:
  placing a first substrate onto a planar upper surface of a substrate carrier comprising a multi-layered disk having upper and lower layers formed of a continuous material and an electrostatic electrode structure dis- posed therebetween, wherein the multi-layered disk is formed symmetrically about a central axis and defines a planar upper surface;

placing a second substrate onto the planar upper surface of the substrate carrier;

energizing the electrode structure using a voltage source to electrostatically hold the first and the second substrates in position on the planar upper surface of the substrate carrier;

inserting the substrate carrier having the electrostatically held first and the second substrates into a process chamber; and performing a process on the electrostatically held first and the second substrates in the process chamber;

wherein the electrode structure is a bipolar electrode structure comprising a continuous inner electrode having a center portion that forms a center portion of the electrode structure and a first group of electrostatic chuck elements that comprise finger-like elements extending radially outward from the center portion of the inner electrode and an outer electrode completely surrounding the inner electrode in a two-dimensional plane and having a second group of electrostatic chuck elements that comprise finger-like elements extending radially inward from an outer circumference of the outer electrode; and wherein respective ones of the finger-like elements of the second group of electrostatic chuck elements are interposed between adjacent ones of the finger-like elements of the first group of electrostatic chuck elements such that the inner electrode and the outer electrode are interdigitated.

2. The method of claim 1, wherein the multi-layered disk comprises a nominal diameter which is a multiple of at least one of a six-inch, four-inch, three-inch, or two-inch standard substrate nominal diameter.

3. The method of claim 2, wherein the multi-layered disk has a circular periphery and wherein each nominal dimension is a diameter.

4. The method of claim 3, wherein each of the first and second placed substrates have a nominal diameter of 150 mm.

5. The method of claim 3, wherein each of the first and second placed substrates have a nominal diameter which is a multiple of at least one of a six-inch, four-inch, three-inch, or two-inch nominal diameter.

6. The method of claim 1, wherein each of the first and second placed substrates are comprised of sapphire.

7. The method of claim 1, wherein the first and second groups of electrostatic chuck elements are energized by the voltage source during the energizing.

8. The method of claim 1, further comprising placing a third substrate onto the planar upper surface prior to the energizing, wherein the third substrate has a different nominal diameter than the first and second substrates.

9. The method of claim 1, further comprising placing a third substrate onto the planar upper surface prior to the energizing, wherein each of the first, second, and third substrates are placed over at least one electrostatic chuck element from each group.

10. The method of claim 1, wherein the upper and lower layers comprise aluminum nitride.

11. The method of claim 1, wherein the multi-layered disk further defines a planar lower surface, and wherein a thickness of the multi-layered disk measured between the upper and lower surfaces is from about 0.70 mm to about 2.20 mm.

12. The method of claim 1, comprising dimensioning and arranging each of the first and second groups of electrostatic chuck elements such that at least one electrostatic chuck element of each group underlies a substrate placed on the upper surface.

13. The method of claim 1, wherein the planar upper surface defined by the multi-layered disk is a polished surface.

14. A method of processing a substrate, comprising:

placing a first substrate onto a planar upper surface of a substrate carrier comprising an electrostatic chuck structure disposed between upper and lower layers of aluminum nitride, wherein the upper layer defines a polished, planar upper surface;

placing a second substrate onto the planar upper surface of the substrate carrier;

energizing the electrostatic chuck structure using a voltage source to exert an electrostatic holding force upon the first and second substrates to electrostatically hold the first and second substrates in position on the planar upper surface of the substrate carrier; and inserting the substrate carrier having the electrostatically held first and second substrates into a process chamber;

wherein the electrostatic chuck structure is a bipolar electrode structure comprising a continuous inner electrode having a center portion that forms a center portion of the electrode structure and a first group of electrostatic chuck elements that comprise finger-like elements extending radially outward from the center portion of the inner electrode and an outer electrode completely surrounding the inner electrode in a two-dimensional plane and having a second group of electrostatic chuck elements that comprise finger-like elements extending radially inward from an outer circumference of the outer electrode; and wherein respective ones of the finger-like elements of the second group of electrostatic chuck elements are interposed between adjacent ones of the finger-like elements of the first group of electrostatic chuck elements such that the inner electrode and the outer electrode are interdigitated.

15. The method of claim 14, wherein the carrier has a nominal dimension which is a multiple of at least one of six, four, three, or two inches so as to accommodate placement, on the planar upper surface, of:

a first combination of substrates wherein all substrates of the first combination have a common nominal dimension; or a second combination of substrates wherein at least one substrate of the second combination has a nominal dimension which is different from a nominal dimension of at least one other substrate of the second combination.

16. The method of claim 14, wherein each of the layers and electrode structure has a nominal outer diameter of from 300 to 301 mm.

17. The method of claim 14, further comprising placing a third substrate onto the planar upper surface prior to the energizing, wherein the third substrate has a different nominal diameter than the first and second substrates.

18. The method of claim 14, wherein each of the first and second placed substrates are comprised of sapphire.

19. The method of claim 1, wherein the finger-like elements of the second group of electrostatic chuck elements of the outer electrode extend radially inward from an outer circumference of the outer electrode until the finger-like elements make contact with the center portion of the Inner electrode.

20. The method of claim 14, wherein the finger-like elements of the second group of electrostatic chuck elements of the outer electrode extend radially inward from an outer circumference of the outer electrode until the finger-like elements make contact with the center portion of the inner electrode.

* * * * *